(12) United States Patent
Liu et al.

(10) Patent No.: US 6,774,669 B1
(45) Date of Patent: Aug. 10, 2004

(54) FIELD PROGRAMMABLE GATE ARRAY FREEWAY ARCHITECTURE

(75) Inventors: Tong Liu, San Jose, CA (US); Sheng Feng, Cupertino, CA (US); Jung-Cheun Lien, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 10/334,338

(22) Filed: Dec. 30, 2002

(51) Int. Cl.[7] .................................... H03K 19/177
(52) U.S. Cl. ...................... 326/41; 326/39; 326/40
(58) Field of Search ............................ 326/38–41

(56) References Cited

U.S. PATENT DOCUMENTS

| | | | |
|---|---|---|---|
| 5,451,887 A | 9/1995 | El-Avat et al. | 326/39 |
| 5,477,165 A | 12/1995 | ElAyat et al. | 326/38 |
| 5,570,041 A | 10/1996 | El-Avat et al. | 326/41 |
| 5,606,267 A | 2/1997 | El Ayat et al. | 326/41 |
| 5,625,301 A | 4/1997 | Plants et al. | 326/41 |
| 5,698,992 A | 12/1997 | El Ayat et al. | 326/41 |
| 6,084,429 A * | 7/2000 | Trimberger | 326/41 |
| 6,211,697 B1 | 4/2001 | Lien et al. | 326/41 |
| 6,242,947 B1 * | 6/2001 | Trimberger | 326/41 |
| 6,476,636 B1 * | 11/2002 | Lien et al. | 326/41 |
| 6,504,398 B1 | 1/2003 | Lien et al. | 326/41 |

* cited by examiner

Primary Examiner—Vibol Tan
(74) Attorney, Agent, or Firm—Sierra Patent Group, Ltd.

(57) ABSTRACT

The disclosed system relates to a freeway routing system and a fast-freeway routing system for a field programmable gate array. The field programmable gate array comprises a two by two array of field programmable gate array tiles. Each tile comprises: a plurality of functional groups arranged in rows and columns; a plurality of interface groups surrounding the plurality of functional groups such that one interface group is positioned at each end of each row and column, each of the interface groups comprising a set of freeway input and output ports; a freeway set of routing conductors configured to transfer signals to the freeway input ports and from the output ports of the interface groups in each of the field programmable gate array tiles. The freeway set of routing conductors comprises: a plurality of vertical conductors that form intersections with a plurality of horizontal conductors; and programmable bi-directional three state interconnect elements located at the intersections. The fast-freeway routing system comprises: a first group of fast-freeway routing conductors, a second group of fast-freeway routing conductors, a third group of fast-freeway routing conductors, and a fourth group of fast-freeway routing conductors.

8 Claims, 11 Drawing Sheets

FIELD PROGRAMMABLE GATE ARRAY FREEWAY ARCHITECTURE

BACKGROUND OF THE INVENTION

1. Field of the Invention

The present disclosed system relates to field-programmable gate arrays, and more particularly, to freeway architectures in field-programmable gate arrays.

2. Description of the Related Art

A field programmable gate array is an integrated circuit (IC) that includes a two-dimensional array of general-purpose logic circuits, called cells or logic blocks, whose functions are programmable. The cells are linked to one another by programmable buses. The cell types may be small multifunction circuits (or configurable functional blocks or groups) capable of realizing Boolean functions of a few variables. The cell types are not restricted to gates. For example, configurable functional groups typically include memory cells and connection transistors that may be used to configure logic functions such as addition, subtraction, etc., inside of the field programmable gate array. A cell may also contain at least one flip-flop. Some types of logic cells found in field programmable gate arrays are those based on multiplexers and those based on programmable read-only memory (PROM) table-lookup memories. Erasable field programmable gate arrays can be reprogrammed many times. This technology is especially convenient when developing and debugging a prototype design for a new product and for small-scale manufacture.

Field programmable gate arrays typically include a physical template that includes an array of circuits, sets of uncommitted routing interconnects, and sets of user programmable switches associated with both the circuits and the routing interconnects. When these switches are properly programmed (set to on or off states), the template or the underlying circuits and interconnects of the field programmable gate array are customized or configured to perform specific customized functions. By reprogramming the on-off states of these switches, a field programmable gate array can perform many different functions. Once a specific configuration of a field programmable gate array has been decided upon, it can be configured to perform that one specific function.

The user programmable switches in a field programmable gate array can be implemented in various technologies, such as ONO antifuse, M-M antifuse, SRAM memory cell, Flash EPROM memory cell, and EEPROM memory cell. Field programmable gate arrays that employ fuses or antifuses as switches can be programmed only once. A memory cell controlled switch implementation of a field programmable gate array can be reprogrammed repeatedly. In this scenario, an NMOS transistor is typically used as the switch to either connect or disconnect two selected points (A, B) in the circuit. The NMOS' source and drain nodes are connected to points A, B respectively, and its gate node is directly or indirectly connected to the memory cell. By setting the state of the memory cell to either logical "1" or "0", the switch can be turned on or off and thus point A and B are either connected or disconnected. Thus, the ability to program these switches provides for a very flexible device.

Field programmable gate arrays can store the program that determines the circuit to be implemented in a RAM or PROM on the field programmable gate array chip. The pattern of the data in this configuration memory ("CM") determines the cells' functions and their interconnection wiring. Each bit of CM controls a transistor switch in the target circuit that can select some cell function or make (or break) some connection. By replacing the contents of CM, designers can make design changes or correct design errors. The CM can be downloaded from an external source or stored on-chip. This type of field programmable gate array can be reprogrammed repeatedly, which significantly reduces development and manufacturing costs.

In general, a field programmable gate array is one type of Programmable Logic Device (PLD), i.e., a device that contains many gates or other general-purpose cells whose interconnections can be configured or "programmed" to implement any desired combinational or sequential function. As its name implies, a field programmable gate array is "field-programmable", meaning that the device is generally programmed by designers or end users "in the field" via small, low-cost programming units. This is in contrast to mask programmable devices which require special steps in the IC chip-manufacturing process.

A field-programming unit typically uses design software to program the field programmable gate array. The design software compiles a specific user design, i.e., a specific configuration of the programmable switches desired by the end-user, into field programmable gate array configuration data. The design software assembles the configuration data into a bit stream, e.g., a stream of ones and zeros, that is fed into the field programmable gate array and used to program the configuration memories for the programmable switches or program the shift registers for anti-fuse type switches. The bit stream creates the pattern of the data in the configuration memory CM that determines whether each memory cell stores a "1" or a "0". Each stored bit the CM controls whether its associated transistor switch is turned on or off. End users typically use design software to test different designs and run simulations for field programmable gate arrays.

When a field programmable gate array that has been programmed to perform one specific function is compared to an Application Specific Integrated Circuit (ASIC) that has been designed and manufactured to perform that same specific function, the field programmable gate array will necessarily be a larger device than the ASIC. This is because field programmable gate arrays are very flexible devices that are capable of implementing many different functions, and as such, they include a large amount of excess circuitry that is either not used or could be replaced with hard-wired connections when performing one specific function. Such excess circuitry generally includes the numerous programmable transistor switches and corresponding memory cells that are not used in implementing the one specific function, the memory cells inside of functional groups, and the field programmable gate array programming circuitry. This excess circuitry is typically eliminated in the design of an ASIC which makes the ASIC a smaller device. An ASIC, on the other hand, is not a flexible device. Once an ASIC has been designed and manufactured it cannot be reconfigured to perform a different function like is possible with a field programmable gate array.

Designers of field programmable gate arrays (as well as other PLDs) often provide their circuit designs to IC manufacturers who typically manufacture the field programmable gate arrays in two different ways. First, a field programmable gate array design may be manufactured as its own chip with no other devices being included in the IC package. Second, a field programmable gate array design may be embedded into a larger IC. An example of such a larger IC is a system on a chip (SOC) that includes the embedded field programmable gate array as well as several other components. The several other components may include, for example, a microprocessor, memory, arithmetic logic unit (ALU), state machine, etc. In this scenario the embedded field programmable gate array may be only a small part of the whole SOC.

BRIEF SUMMARY OF THE INVENTION

The disclosed system relates to a freeway routing system for a field programmable gate array. The field programmable gate array comprises an array of field programmable gate array tiles. Each tile comprises: a plurality of functional groups arranged in rows and columns; a plurality of interface groups arranged such that one interface group is positioned at each end of each row and column, each of the interface groups comprising a set of freeway input and output ports; a freeway set of routing conductors configured to transfer signals to the freeway input ports and from the output ports of the interface groups in each of the field programmable gate array tiles. The freeway set of routing conductors comprises: a plurality of vertical conductors that form intersections with a plurality of horizontal conductors; and programmable bidirectional three state interconnect elements located at the intersections.

The disclosed system also relates to a fast-freeway routing system for a field programmable gate array. The field programmable gate array comprises: a two by two array of field programmable gate array tiles. Each tile comprises: a plurality of functional groups arranged in rows and columns; a plurality of interface groups surrounding the plurality of functional groups such that one interface group is positioned at each end of each row and column, and wherein N interface groups are positioned along a vertical inner edge of the tile and N interface groups are positioned along a horizontal inner edge of the tile, and wherein each of the interface groups along the vertical inner edge and the horizontal inner edge comprise a set of fast-freeway input and output ports; a first group of N fast-freeway routing conductors, wherein each of the first through Nth routing conductors of the first group couples the first through Nth interface groups along a first tile's vertical inner edge to the first through Nth interface groups along a second tile's vertical inner edge, to the first through Nth interface groups along the second tile's horizontal inner edge, to the first through Nth interface groups along the third tile's horizontal inner edge, respectively; a second group of N fast-freeway routing conductors, wherein each of the first through Nth routing conductors of the second group couples the first through Nth interface groups along a second tile's vertical inner edge to the first through Nth interface groups along a second tile's horizontal inner edge, to the first through Nth interface groups along the third tile's horizontal inner edge, to the first through Nth interface groups along the third tile's vertical inner edge, respectively; a third group of N fast-freeway routing conductors, wherein each of the first through Nth routing conductors of the third group couples the first through Nth interface groups along a second tile's horizontal inner edge to the first through Nth interface groups along a third tile's horizontal inner edge, to the first through Nth interface groups along the third tile's vertical inner edge, to the first through Nth interface groups along the fourth tile's vertical inner edge, respectively; and a fourth group of N fast-freeway routing conductors, wherein each of the first through Nth routing conductors of the fourth group couples the first through Nth interface groups along a third tile's vertical inner edge to the first through Nth interface groups along a fourth tile's vertical inner edge, to the first through Nth interface groups along the fourth tile's horizontal inner edge, to the first through Nth interface groups along the first tile's horizontal inner edge, respectively.

A better understanding of the features and advantages of the present disclosed system will be obtained by reference to the following detailed description of the disclosed system and accompanying drawings which set forth an illustrative embodiment in which the principles of the disclosed system are utilized.

DETAILED DESCRIPTION OF THE INVENTION

Figure 1:
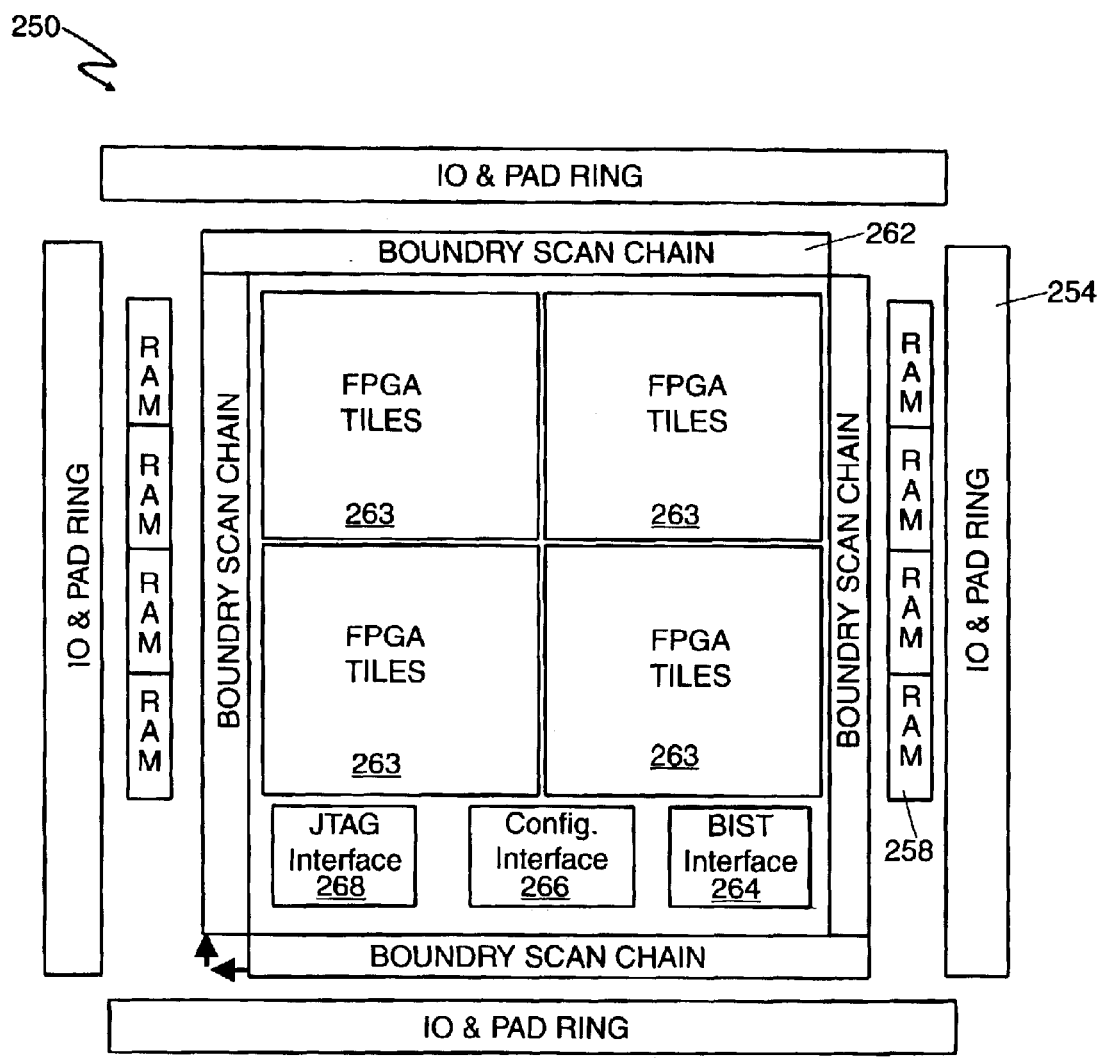
FIG. 1 is a schematic illustrating an overall view of one embodiment of the invention.

FIG. 1 is a schematic illustrating an overall view of one embodiment of the invention. Field-programmable gate array (FPGA) 250 has IO & PAD ring 254 the outer perimeter. RAM blocks 258 are between IO & PAD ring 254 and boundary scan chains 262. In this embodiment, four FPGA tiles 263 are shown arranged in a 2 by 2 matrix. Built-in self-test interface module ("BIST") 264 is adjacent to FPGA tiles 23. Configuration interface 266 is a configuration control module that receives a bitstream program into its configuration RAM. Joint Test Action Group ("JTAG") interface 268 is a module that is an access point that allows for high-level test control.

Figure 2:
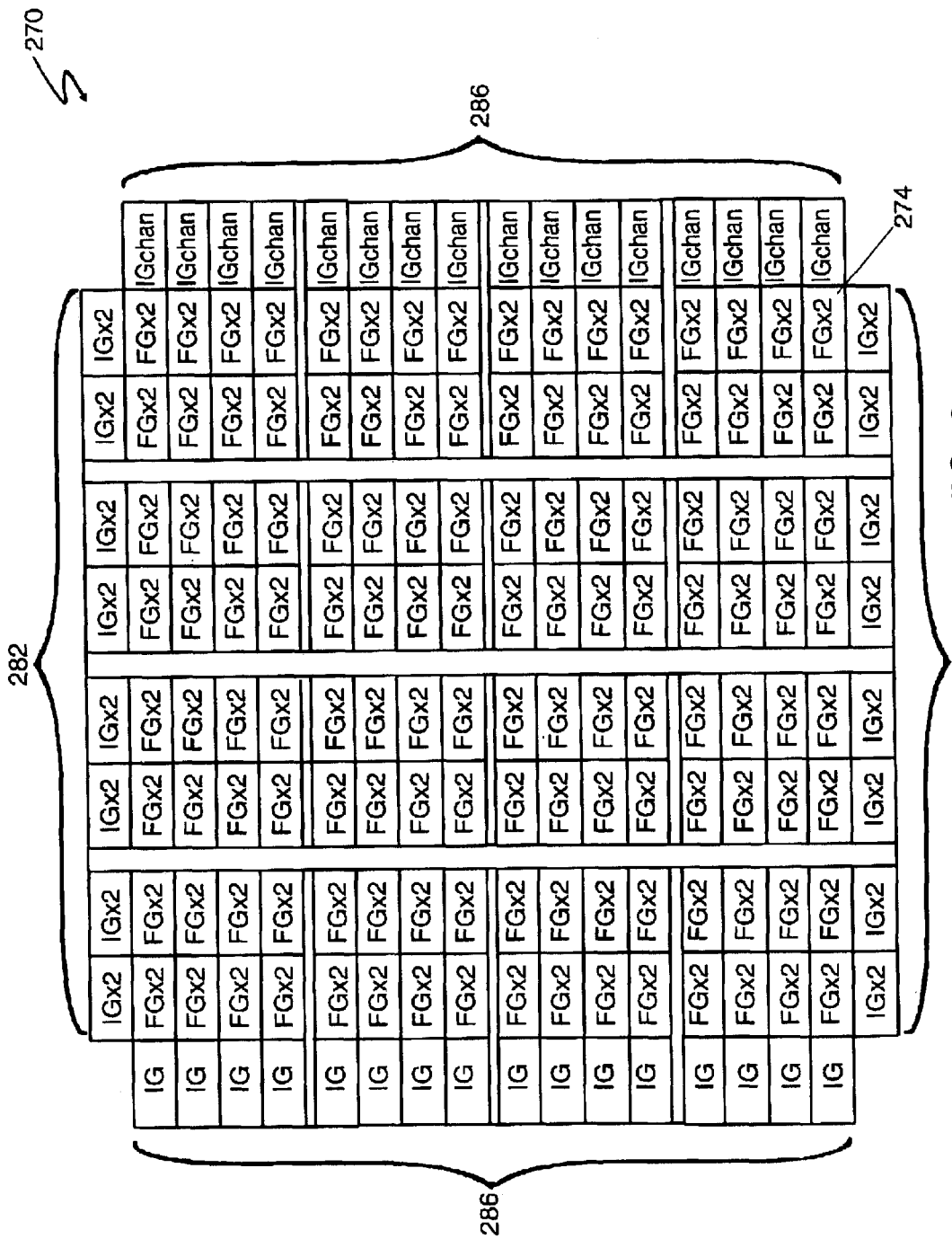
FIG. 2 is a schematic illustrating a more detailed view of the schematic in FIG. 1.

FIG. 2 is a schematic illustrating a more detailed view of one FPGA tile 263 from FIG. 1. In one embodiment, each FPGA tile 270 is made up of a plurality of functional groups, wherein the functional groups are arranged in side-by-side pairs of functional groups (each side by side pair of functional groups may be referred to as a "FGx2") 274. The functional groups arc small multifunction circuits that are capable of realizing Boolean functions. The functional groups include Look-Up Tables (LUTs) and other circuits capable of realizing many Boolean functions, as well as memory cells that are used to configure logic functions such as addition, subtraction, etc.

In one embodiment, the FGx2s are arranged in a 16 by 8 array. Since an FGx2 is a pair of side by side functional groups, then this array is equivalent to a 16 by 16 array of functional groups. Each row containing 8 FGx2s comprises 16 functional groups because there are 2 side by side functional groups in each FGx2. Please refer to FIG. 3 for a more detailed view of an FGx2.

At both ends of each row and column of functional groups are the interface groups ("IGs"). The interface groups are used for interfacing field programmable gate array tiles to other field programmable gate array tiles or devices, or to pad rings for connecting the field programmable gate array tiles to IC package pins. In general, the logic structure of the field programmable gate array tile is provided by the functional groups and the interface groups.

Also included in the field programmable gate array tiles, but not shown in FIG. 2, are several horizontal and vertical regular routing buses, routing interconnect areas, switching transistors, and global signal distribution routing structure, all of which will be discussed below.

Figure 3:
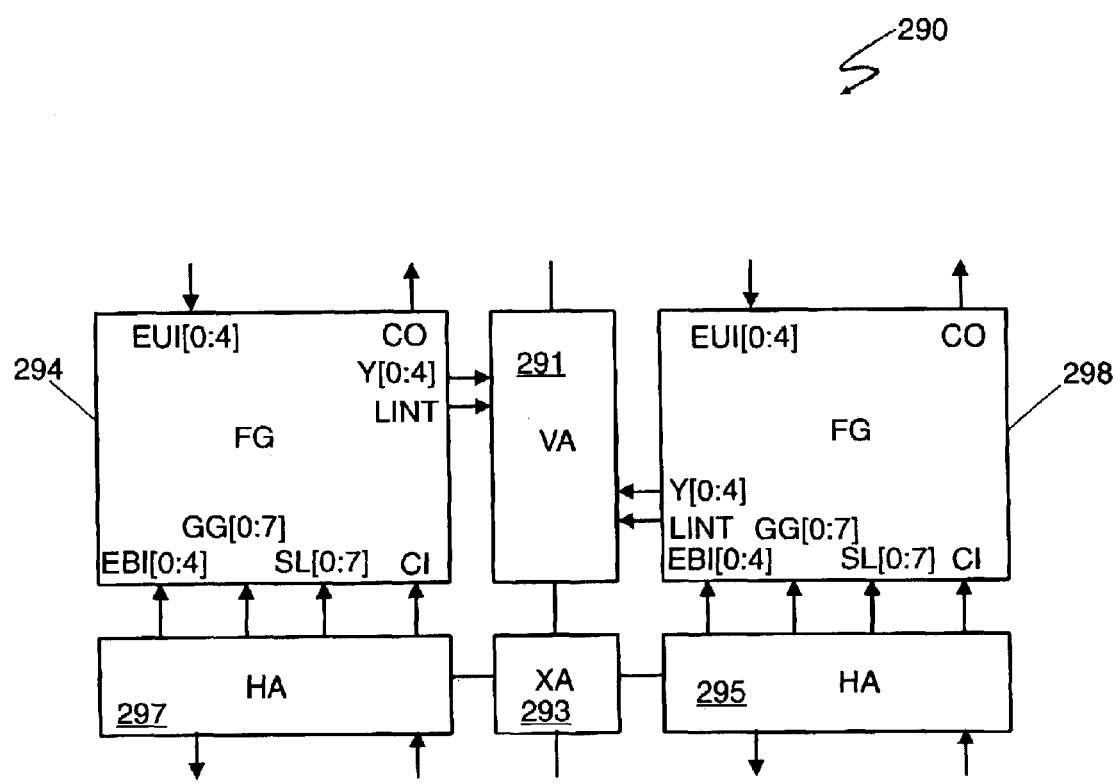
FIG. 3 is a schematic illustrating one embodiment of a functional group.

FIG. 3 is a schematic illustrating a more detailed view of FGx2 290. FGx2 290 comprises functional groups 294 and 298. Each functional group 294 and 298 is configured to receive inputs from the following routing resources: EUI[0:4], EBI[0:4], GG[0:7], SL[0:7] and CI. Both functional groups 294 and 298 are also configured to send outputs through the following resources: CO, Y[0:4], and LINT ports. The LINT ports carry a secondary routing signal. Between functional groups 294 and 298 is a vertical channel containing vertical VA bus 291 that carries the following routing resources: VT[0:11][0:4], VSL[0:7], VLL[0:9], and VCL[0:9]. The convention of [0:11][0:4] means that there are 12 (0 through 11) sets of 5 (0 through 4) routing resources. Adjacent to VA bus 291 is XA bus 293. Horizontal HA busses 295 and 297 carry the following routing resources: HT[0:11][0:4], HSL[0:7], HLL[0:9], HCL[0:9], and HFT[0:4].

Figure 4:
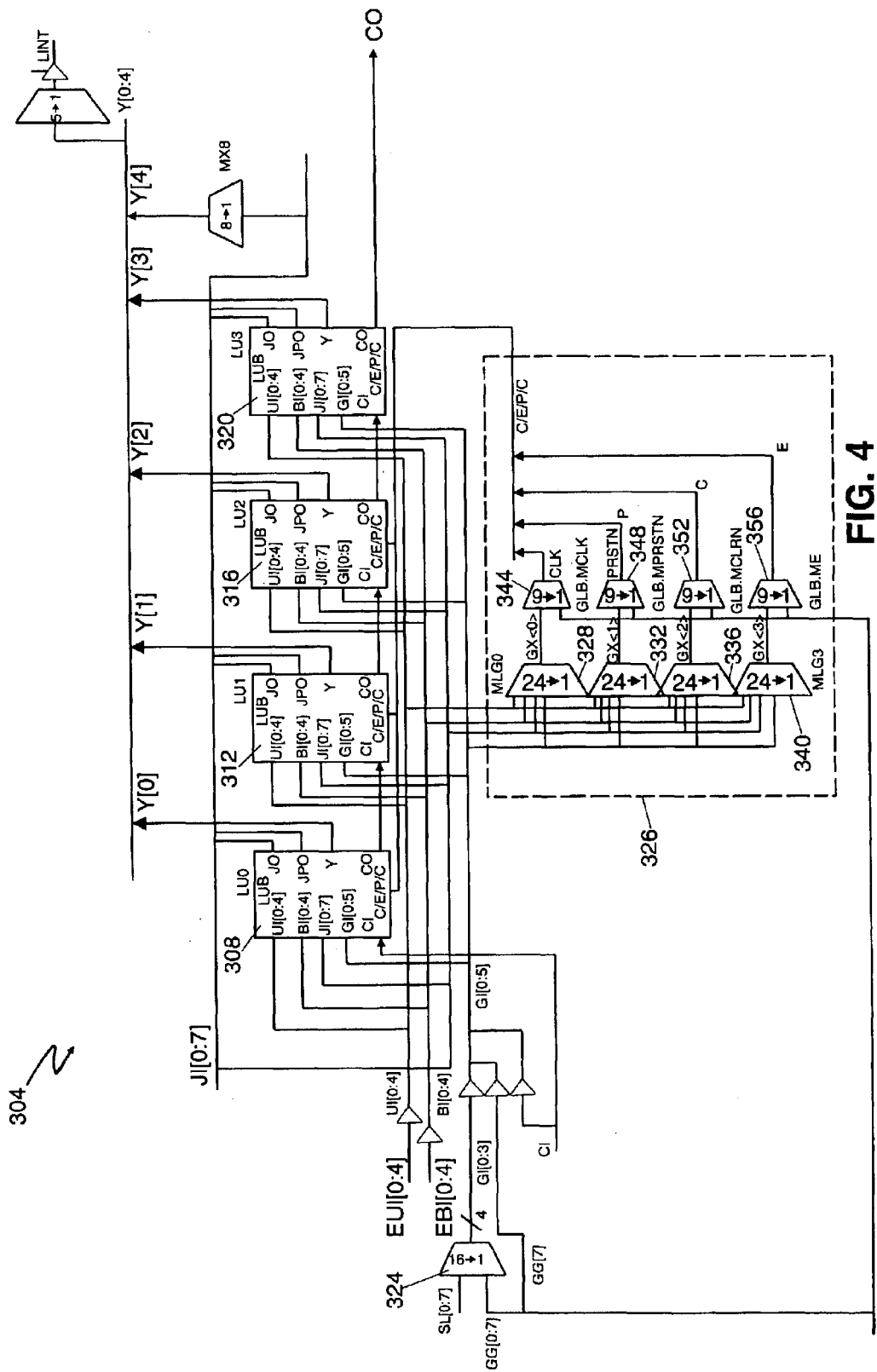
FIG. 4 is a schematic illustrating a more detailed view of a functional group, featuring logic units and associated circuitry.

FIG. 4 is a schematic illustrating a more detailed view of functional groups from FIG. 3. Each functional group 304 may include four logic units ("LUBs") 308, 312, 316, and 320. Each LUB is coupled to routing resource Y[0] through Y[3] respectively. LUBs 308, 312, 316 and 320 provide Boolean functions and logic operations of functional group 304. Each of LUBs 308, 312, 316 and 320 includes several inputs on which Boolean functions and logic operations are performed. Each LUB 308, 312, 316 and 320 includes twenty-four such inputs plus a CI input and a C/E/P/C input, but it should be understood that the number of inputs may vary in accordance with the invention. Specifically, each of LUBs 308, 312, 316 and 320 receives signals through input ports UI[0:4] and BI[0:4] which correspond to signals received through regular input ports EUI[0:4] and EBI[0:4]. Also, each LUB 308, 312, 316 and 320 receives signals through input ports GI[0:5] and JI[0:7]. The input signals via input port JI[0:7] include two output signals JO and JPO from each LUB 308, 312, 316 and 320. Thus, two output signals JO and JBO of each LUB 308, 312, 316 and 320 are fed back to the inputs by way of JI[0:7].

Input signals GI[0:5] are selected from the SL[0:7] and GG[0:7] routing resources. Sixteen-to-one multiplexer 324 selects one of the inputs from routing resources SL[0:7] and GG[0:7] and makes four copies of the selected input, as indicated by slash "/" and associated number "4". Thus routing resource GI[0:3] is shown exiting multiplexer 324. Routing resource GG[7] and CI are added to GI[0:3] bus, thereby forming GI[0:5] bus.

Each of LUBs 308, 312, 316 and 320 also includes a clock/enable/preset/clear ("C/E/P/C") input. The C/E/P/C input is used to control a flip-flop included inside each of LUBs 308, 312, 316 and 320. The C/E/P/C input signal is generated by selection circuitry, included in the dashed lines of box 326. The C/E/P/C selection circuitry receives inputs UI[0:4], BI[0:4], JI[0:7], and GI[0:5] at each of twenty-four-to-one multiplexers 328, 332, 336 and 340. Each multiplexer 328, 332, 336 and 340 selects one signal from buses UI[0:4], BI[0:4], JI[0:7], and GI[0:5]. Each signal selected by each multiplexer 328, 332, 336 and 340 is sent to four nine-to-one multiplexers 344, 348, 352 and 356 via routing resources GX[0], GX[1], GX[2], and GX[3] respectively. Each of nine-to-one multiplexers 344, 348, 352, and 356 also receives an input from GG[0:7] routing resource. The signal selected by multiplexer 344 becomes clock signal CLK, the signal selected by multiplexer 348 becomes preset signal PRSTN ("P"), the signal selected by multiplexer 352 becomes clear signal CLRN("C"), and the signal selected by multiplexer 356 becomes enable signal E. The use of multiplexers 344, 348, 352 and 356 allows any of the signals GX[0:3], GG[0:7], and ground to be selected as one of the C/E/P/C signals.

The GG[0:7] bus is an inter-tile global bus that is coupled to every functional group in all FPGA tiles. The signals in the GG[0:7] bus are often selected as the C/E/P/C signals. It should be well understood, however, that the illustrated C/E/P/C selection circuitry from FIG. 4 is just one exemplary version of such a selection circuit and that various different designs of C/E/P/C selection circuit 326 may be used to select various different signals in accordance with the present disclosed system. In one embodiment, LUBs 308, 312, 316 and 320 are all of the same design, but in another embodiment they have different designs.

Figure 5:
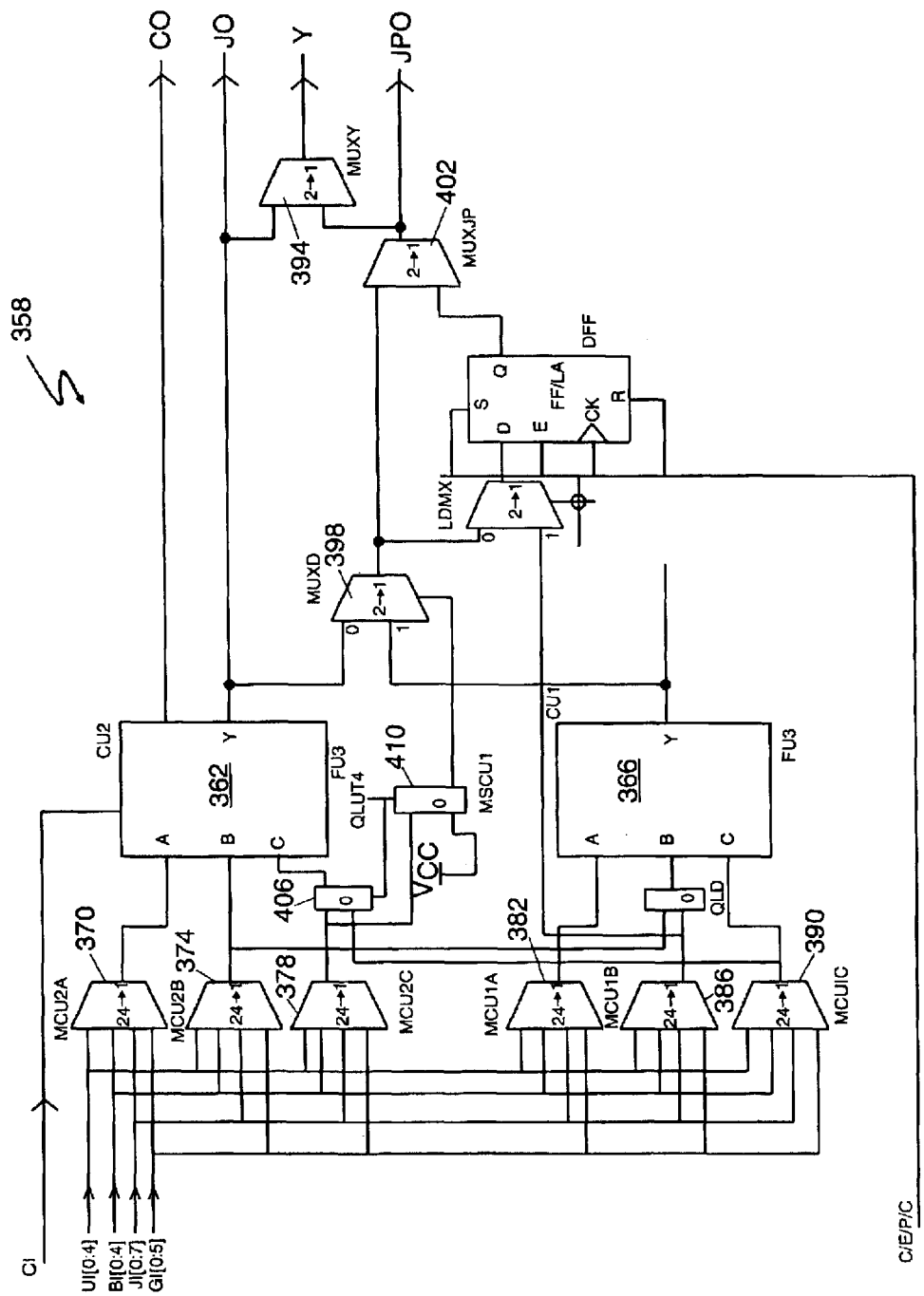
FIG. 5 is a schematic illustrating a more detailed view of a logic unit, featuring look-up tables and associated circuitry.

FIG. 5 is a schematic illustrating a more detailed view of one of LUBs 308, 312, 316, and 320 from FIG. 4. LUB 358 includes Look-Up Tables ("LUTs") 362 and 366. LUTs 362 and 366 comprise three inputs A, B, C, one output Y, and several internal memory cells (not shown). LUT 362 also comprises an additional output CO. LUTs 362 and 366 are configured by programming internal memory cells (not shown), and the setting of the internal memory cells taken together provides a specific configuration for each of LUTs 362 and 366. The configuration data used to program the internal memory cells is generated by design software. Once a specific configuration of the internal memory cells is decided upon, the inputs A, B, C may be used to generate the output Y in accordance with the desired logic function.

The inputs A, B, C of the LUT 362 are provided by twenty-four-to-one multiplexers 370, 374 and 378, respectively, and inputs A, B, C of LUT 366 are provided by twenty-four-to-one multiplexers 382, 386 and 390, respectively. Each of multiplexers 370, 374, 378, 382, 386, 390 receives as inputs the four buses EUI[0:4], EBI[0:4], JI[0:7], and GI[0:5]. Therefore, three signals are selected from these twenty-four signals as inputs A, B, C for each of LUTs 362 and 366.

When only a three input LUT is needed, one of LUTs 362 and 364 is used. In one embodiment, LUT 362 is used while LUT 364 is not used. The Y output of LUT 362 can be sent directly to the JO output of LUB 358, or the Y output of LUT 362 can be sent to the Y output of LUB 358 by using two-to-one multiplexer 394 to select the Y output of LUT 362. Additionally, the Y output of LUT 362 can be sent to the JPO output of the LUB 358 by using two-to-one multiplexer 398 to select the Y output of the LUT 362 and two-to-one multiplexer 402 to select the output of multiplexer 398. Thus, multiplexers 394, 398 and 402 can be used to send the Y output of LUT 362 to any of the outputs Y, JO, JPO of the LUB 358.

Additionally, when two, three input LUTs are needed, LUT 362 and 366 can be used independently as three input LUTs. The Y output of LUT 362 can be sent directly to the JO output of LUB 358, or the Y output of the LUT 362 can be sent to the Y output of the LUB 358 by using two-to-one multiplexer 394 to select the Y output of LUT 362. The Y output of LUT 366 can be sent directly to the JPO output of LUB 358, or the Y output of the LUT 366 can be sent to the Y output of the LUB 358 by using two-to-one multiplexer 394 to select the output of two-to-one multiplexer 402, which can select the output of two-to-one multiplexer 398, which can select the Y output of the LUT 366.

As stated previously, one purpose of including two LUTs in the LUB is so that they can be used together to provide a four-input LUT. Specifically, the Y output of LUT 362 and the Y output of LUT 366 are connected to the inputs of two-to-one multiplexer 398. In order to simulate a single, four-input LUT, two-to-one multiplexer 406 selects the signal from twenty-four-to-one multiplexer 390 as input C to LUT 362. Two-to-one multiplexer 410 selects the signal from twenty-four-to-one multiplexer 378 as the fourth input to LUT 362. Thus, both LUTs 362 and 366 receive the first, second and third inputs at their A, B, and C inputs and multiplexer 410 is programmed to select the fourth input and provide it to the control input of multiplexer 398.

According to well-known Boolean logic techniques and the Shannon Expansion, connecting three-input LUTs 362 and 366 in this manner will simulate a single four-input LUT with the result being generated at the output of multiplexer 398. The output of multiplexer 398 can be provided to the JPO output of LUB 358 by way of multiplexer 402 or to the Y output of LUB 358 by way of the multiplexers 394 and 402.

Figure 6A:
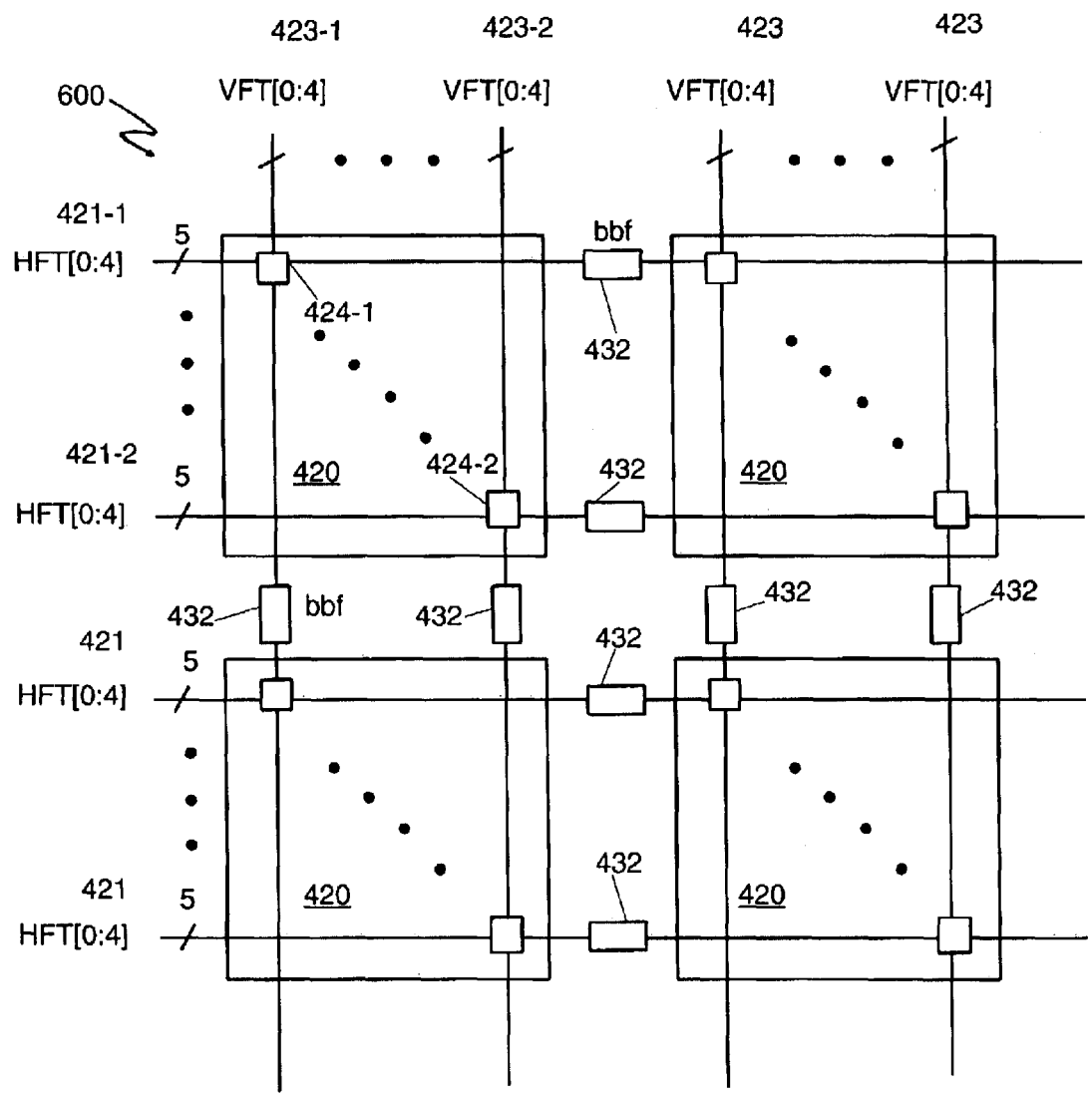
FIGS. 6A–C are schmatics illustrating the freeway routing system on a two by two array of field programmable gate array tiles.

FIG. 6a is a schematic illustrating "freeway" routing structure 600. A "freeway architecture" or "freeway routing structure" enables more rapid transmission of signals between FPGA tiles than conventional routing architectures because signals may be transmitted across part or all of a chip through a freeway architecture. The freeway architecture includes fast and regular transmission through signal buffers and long, bent wires for rapid diagonal transmission. One embodiment of the invention is the freeway architecture.

For example, routing structure 600 enables high performance routing on long distance nets. Occasionally one functional group sends a signal to a functional group in another FPGA tile or IO/RAM and the needed connections cannot be made with routing conductors typically used. Instead, the signal may be sent by routing structure 600. Also, routing structure 600 may also be used to connect interface groups of FPGA tiles to interface groups of IOs or interface groups of RAM.

FPGA tiles 420 are in a two-by-two array that comprises freeway routing structure 600. Signals are sent through horizontal routing conductors 421 and vertical routing conductors 423 that can be used to send a signal in situations when the other sets of routing conductors cannot be used to send a signal to the intended destination. There are 16 vertical freeway routing resources VFT[0:4] 423 on each FPGA tile 420, although for simplicity only two vertical freeway tracks VFT[0:4] are shown. Also on each FPGA tile 420 are 16 horizontal freeway routing resources HFT[0:4] 421, although again, for simplicity, only two horizontal freeway routing resources are shown. Labeling, from left to right and top to bottom, horizontal and vertical freeway routing resources 421 and 423 from one to sixteen, the number one vertical freeway routing resource 423-1 intersects the number one horizontal freeway routing resource 421-1 at intersection area 424-1. The sixteenth vertical freeway routing resource 423-2 intersects the sixteenth horizontal freeway routing resource 421-2 at intersection area 424-2. Similarly the second through the fifteenth vertical freeway routing resources 423 intersect the second through fifteenth horizontal freeway routing resources 421, at intersection areas (not shown).

For each of FPGA tiles 420, vertical and horizontal routing resources 423 and 421 are the same. There are 32 vertical freeway routing resources 423 in freeway routing structure 600. Similarly, there are 32 horizontal freeway routing resources 421, in freeway routing structure 600.

Located between each FPGA tile 420 and on each horizontal and vertical freeway routing resource 421 and 423 is segmentation buffer 432. Break buffer 432 isolates a signal in the line on one side of the segmentation buffer from a signal on the line on the other side of the segmentation buffer.

Figure 6B:
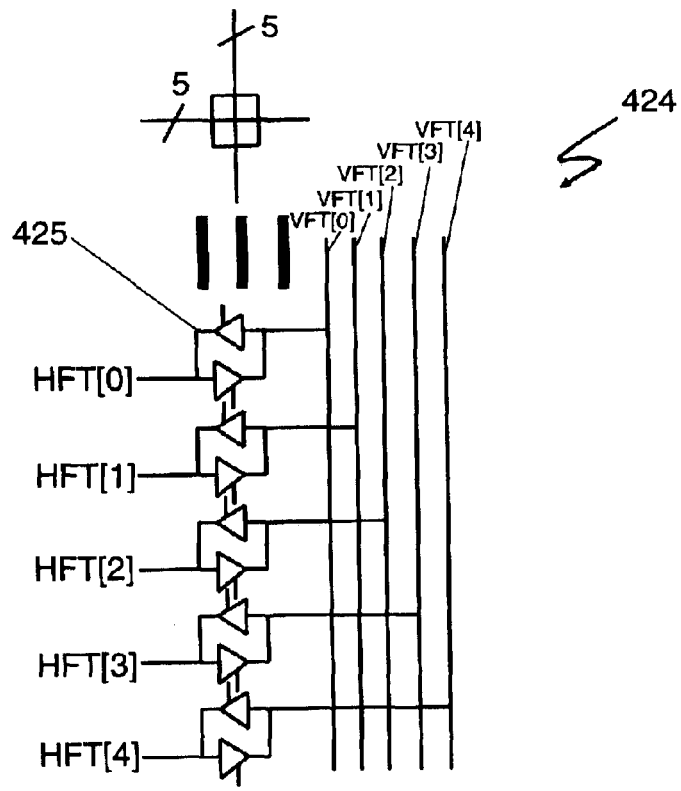

FIG. 6b is a schematic illustrating intersection area 424 of FIG. 6a. Intersection area 424 includes horizontal freeway routing resource HFT[0:4] coupling to vertical freeway routing resource VFT[0:4]. Each line of HFT[0:4] couples to programmable bidirectional 3 state buffer arrangement 425, which in turn is coupled to each vertical line of VFT[0:4], respectively.

Figure 6C:
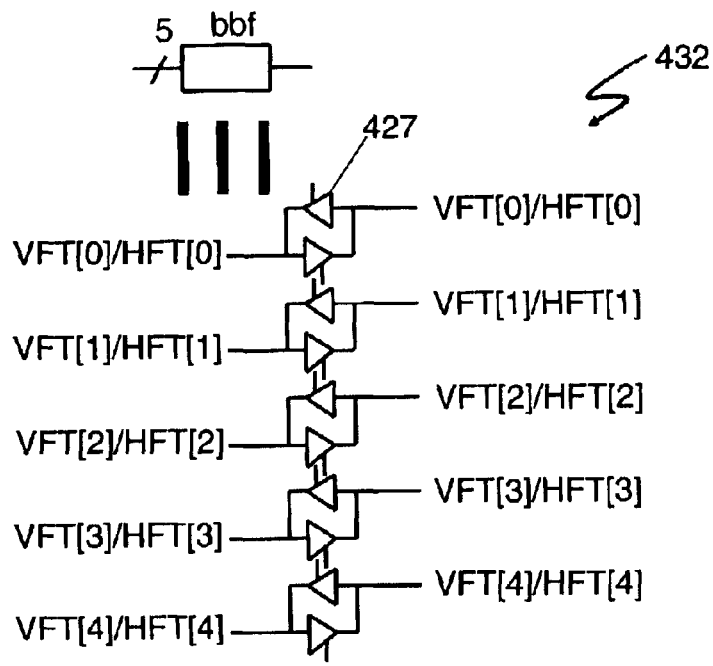

FIG. 6c is a schematic illustrating segmentation buffer 432 from FIG. 6a. Each line of HFT[0:4] and VFT[0:4] is bisected between each FPGA tile 420 by segmentation buffer 432. Each segmentation buffer 432 comprises programmable bi-directional 3 state buffers 427 for each line arranged in the manner shown in FIG. 6c.

Figure 7:
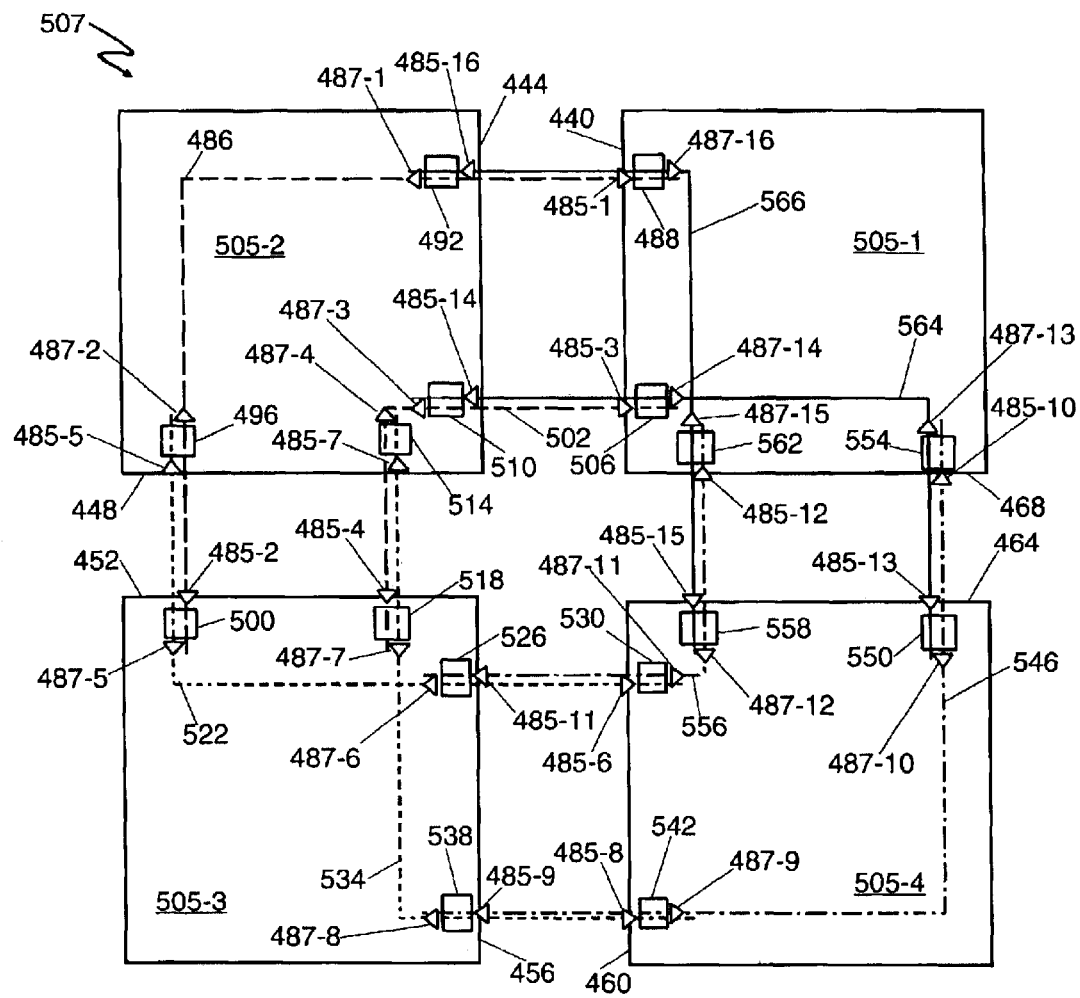
FIG. 7 is a schematic illustrating the fast-freeway routing system on a two by two array of field programmable gate array tiles.

FIG. 7 is a schematic illustrating the fast-freeway routing resource. FPGA tiles 505 are arranged in two-by-two array 507. Each tile 505 may comprise an array of 16 by 16 functional groups (see FIG. 2). At the end of each row and column of functional groups are interface groups. The fast-freeway routing resource is a way to quickly route signals between interface groups on the "vertical inner edge" (440, 440, 456, and 460) and "horizontal inner edge" (468, 448, 452, and 464) of each of the tiles.

There are four groups with 2 lines per group illustrated in FIG. 7. The two lines represent the first and last line of a 16-line group (not shown). The first group couples interface groups from tiles 505-1, 505-2 and 505-3 with lines 486 and 502. The second group couples interface groups from tiles 505-1, 505-2, and 505-4 with lines 564 and 566. The third group couples interface groups from tiles 505-2, 505-3, and 550-4 with lines 522 and 534. The fourth group couples interface groups from tiles 505-1, 505-3, and 550-4 with lines 546 and 556.

For convenience, a numbering convention may be applied to the field programmable gate array tiles wherein tile 505-1 may be referred to as the "first" tile, tile 505-2 may be referred to as the "second" tile, tile 505-3 may be referred to as the "third" tile and tile 505-4 may be referred to as the "fourth" tile. In order to more clearly show the routing resources, few interface groups and no functional groups are illustrated in FIG. 7. See FIG. 2 for one example of an FPGA tile.

The interface groups may be numbered in the following manner, wherein the top interface group of each column of interface groups may be referred to as the "first" interface group, and the bottom interface group of each column may be referred to as the "Nth" group, wherein N may be equal to 16 in one embodiment, but in another embodiment N may be any other non-zero integer depending on the needs of the user. The left-most interface group in any row of interface groups may be referred to as the "first" interface group, and the rightmost interface group may be referred to as the "Nth" interface group, wherein N may be equal to 16 in one embodiment, but in another embodiment N may be any other non-zero integer depending on the needs of the user. Each interface group has one of output drivers 487 and one of input drivers 485, each of which couples to a fast-freeway line.

The first group of fast-freeway routing resources (conductors) is shown with a dashed line. First line 486 from the first group of fast-freeway routing resources couples to input driver 485-1 of interface group 488, to output driver 487-1 of interface group 492, to output driver 487-2 of interface group 496 and finally to input driver 485-2 of interface group 500.

Similarly, sixteenth line 502 (in this example, each line of a two line group represents one of sixteen lines, hence first line and sixteenth line) of the first group of the fast-freeway routing resources couples to input driver 485-3 of interface group 506, to output driver 487-3 of interface group 510, to output driver 487-4 of interface group 514 and finally to input driver 485-4 of interface group 518. Not shown, but following the same architecture, each of the 14 remaining interface groups between interface group 488 and interface group 506, the 14 remaining interface groups between interface group 492 and interface group 510, the 14 remaining interface groups between interface group 496 and interface group 514, and the 14 remaining interface groups between interface group 500 and 518, are each respectively coupled to each other via their own first group fast-freeway routing line.

First line 522 of the second group of fast-freeway routing resources, shown with a dotted line, is coupled to input driver 485-5 of interface group 496, output driver 487-5 of interface group 500, output driver 487-6 of interface group 526 and input driver 485-6 of 530. Similarly, 16$^{th}$ line 534 of the second group of fast-freeway routing resources is coupled to input driver 485-7 of interface group 514, output driver 487-7 of interface group 518, output driver 487-8 of interface group 538 and input driver 485-8 of 542. Not shown, but following the same architecture, each of the 14 remaining interface groups between interface group 496 and interface group 514, the 14 remaining interface groups between interface group 500 and interface group 518, the 14 remaining interface groups between interface group 526 and interface group 538, and the 14 remaining interface groups between interface group 530 and 542, are each respectively coupled to each other via their own second group fast-freeway routing line.

First line 546 of the third group of fast-freeway routing resources, shown with a dashed-dotted line, is coupled to input driver 485-9 of interface group 538, output driver 487-9 of interface group 542, output driver 487-10 of interface group 550 and input driver 485-10 of 554. Similarly, sixteenth line 556 of the third group of fast-freeway routing resources is coupled to input driver 485-11 of interface group 526, output driver 487-11 of interface group 530, output driver 487-12 of interface group 558 and input driver 485-12 of 562. Not shown, but following the same architecture, each of the 14 remaining interface groups between interface group 526 and interface group 538, the 14 remaining interface groups between interface group 530 and interface group 542, the 14 remaining interface groups between interface group 558 and interface group 550, and the 14 remaining interface groups between interface group 562 and 554, are each respectively coupled to each other via their own third group fast-freeway routing line.

First line 564 of the fourth group of fast-freeway routing resources, shown with a solid line, is coupled to input driver 485-13 of interface group 550, output driver 487-13 of interface group 554, output driver 487-14 of interface group 506 and input driver 485-14 of 510. Similarly, the sixteenth line 566 of the fourth group of fast-freeway routing resources. is coupled to input driver 485-15 of interface group 558, output driver 487-15 of interface group 562, output driver 487-15 of interface group 488 and input driver 485-16 of 492. Not shown, but following the same architecture, each of the 14 remaining interface groups between interface group 550 and interface group 558, the 14 remaining interface groups between interface group 562 and interface group 554, the 14 remaining interface groups between interface group 488 and interface group 506, and the 14 remaining interface groups between interface group 492 and 510, are each respectively coupled to each other via their own fourth group fast-freeway routing line.

One aspect of the invention includes the fast-freeway routing conductors (resources) bent at an angle and coupling together the interface groups without passing through a switch.

Figure 8:
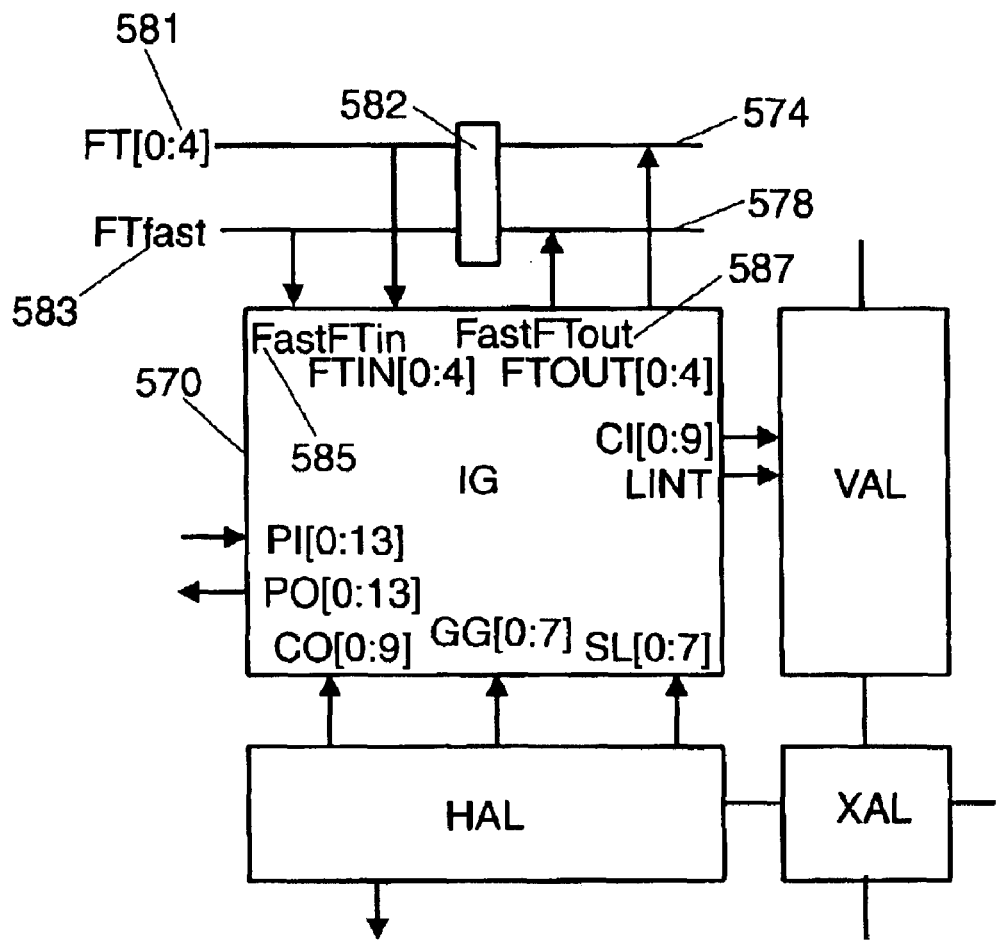
FIG. 8 is a schematic illustrating the freeway and fast-freeway routing system in relation to an interface group.

FIG. 8 is a schematic illustrating a more detailed view of the routing resources, including the freeway and fast-freeway routing resources adjacent to interface group 570. Interface group 570 is a representative of any of the interface groups in FIGS. 2 or 7 that are not one of a pair of interface groups comprising an IGx2, which are described below with respect to FIG. 9. Interface group 570 has the following inputs: PI[0:13], CO[0:9], GG[0:7], SL[0:7] and the following outputs: PO[0:13], LINT, and CI[0:9].

In addition, freeway routing resource FT[0:4] 581 is coupled to interface group 570 via input FTIN[0:4] and the output FTOUT[0:4] couples resource 581 to resource 574. Fast-freeway routing resource FTfast 583 is also coupled to interface group 570 via input FastFTin 585 and output FastFTout 587 couples resource 583 to resource 578. Break buffer 582, similar to the one shown in FIG. 6c, but in this case with 6 lines rather than 5, isolates resource 581 from resource 574, and resource 583 from resource 578. Break buffer 582 allows the user to isolate the freeway routing resource input side from the output side. Likewise the break buffer allows the user to isolate the fast-freeway routing resource input side from the output side.

FIG. 8 relates to FIG. 7 in the following manner. FastFTin 585 of FIG. 8 represents an input driver 485 of FIG. 7 and FastFTout 587 of FIG. 8 represents an output driver 487 of FIG. 7. Using one interface group, in this example, fast-freeway routing resource FTfast 583 of FIG. 8 represents first line 522 of the second group of fast-freeway routing resources of FIG. 7. Interface group 570 of FIG. 8 represents interface group 496 of FIG. 7. Therefore, FastFTin 585 of FIG. 8 represents input driver 485-5 of FIG. 7 and FastFTout 587 of FIG. 8 represents output driver 487-2 of FIG. 7. Finally, fast-freeway routing resource FTfast 578 of FIG. 8 represents first line 486 of the first group of fast-freeway routing resources of FIG. 7. Break buffer 582 of FIG. 8 is not shown in FIG. 7.

Figure 9:
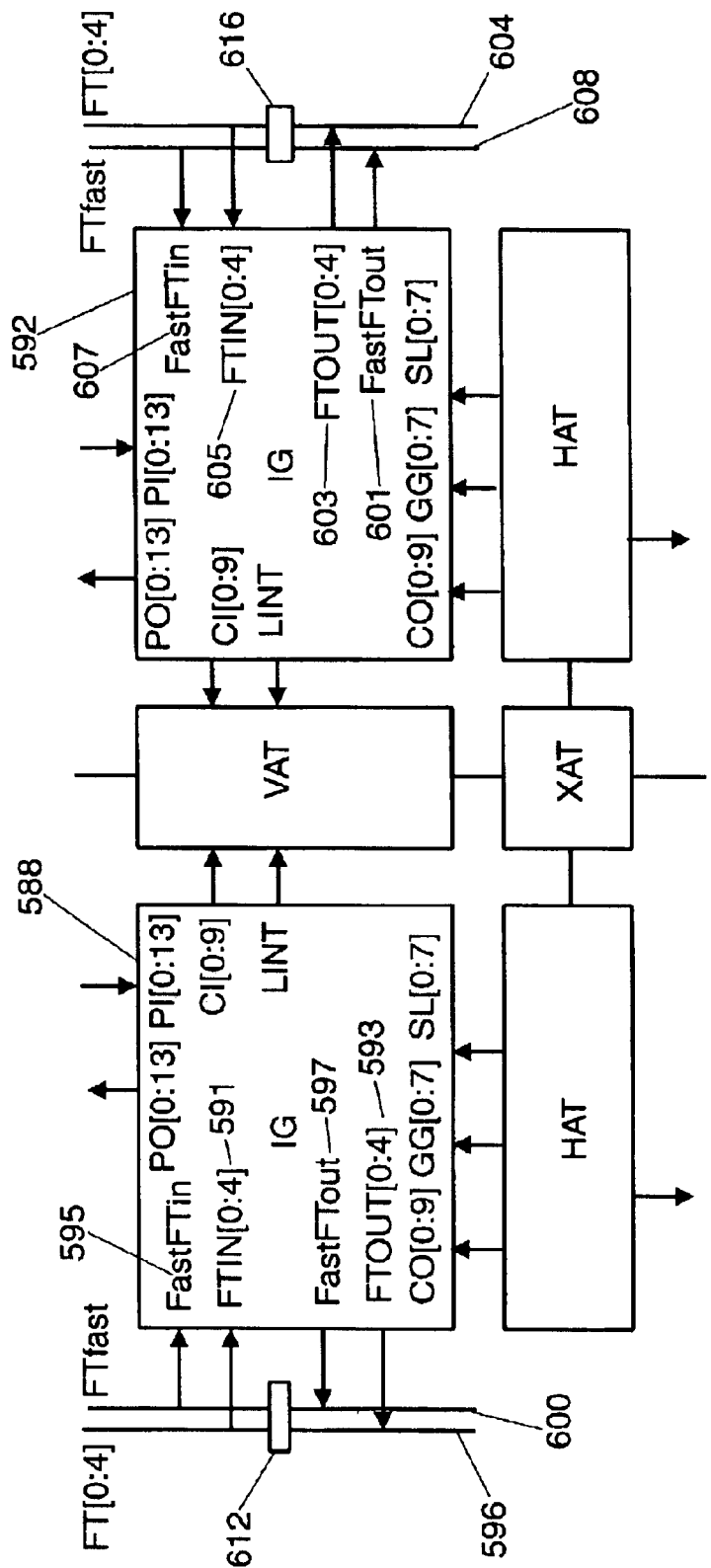
FIG. 9 is a schematic illustrating the freeway and fast-freeway routing system in relation to a side-by-side pair of interface groups.

FIG. 9 is a schematic illustrating a more detailed view of a typical sideby-side grouping of interface groups first shown in FIG. 2 and collectively referred to as an "IGx2". Interface groups 588 and 592 each has the following outputs: PO[0:13], CI[0:9], and LINT. Each interface group 588 and 592 has the following inputs: PI[0:13], CO[0:9], GG[0:7], and SL[0:7].

Interface groups 588 and 592 are each coupled to freeway routing resources 596 and 604 and a fast-freeway routing resource 600 and 608, respectively. Interface group 588 is coupled to freeway routing resource 596 by input FTIN[0:4] 591 and output FTOUT[0:4] 593. Interface group 588 is coupled to fast-freeway routing resource 600 by input fast-FTin 595 and output fastFTout 597.

Interface group 592 is coupled to freeway routing resource 604 via input FTIN[0:4] 605 and output FTOUT [0:4] 603. Interface group 592 is coupled to fast-freeway routing resource 608 by input fastFTin 607 and output fastFTout 601. Located on fast-freeway and freeway routing resources 608 and 604 between the inputs and outputs and on fast-freeway and freeway routing resources 600 and 596 between the inputs and outputs are bi-directional 3-state break buffers 612 and 616. Break buffers 612 and 616 allow the user to isolate the freeway routing resources input side from the output side. Likewise the break buffers allow the user to isolate the fast-freeway routing resource input side from the output side.

Figure 10:
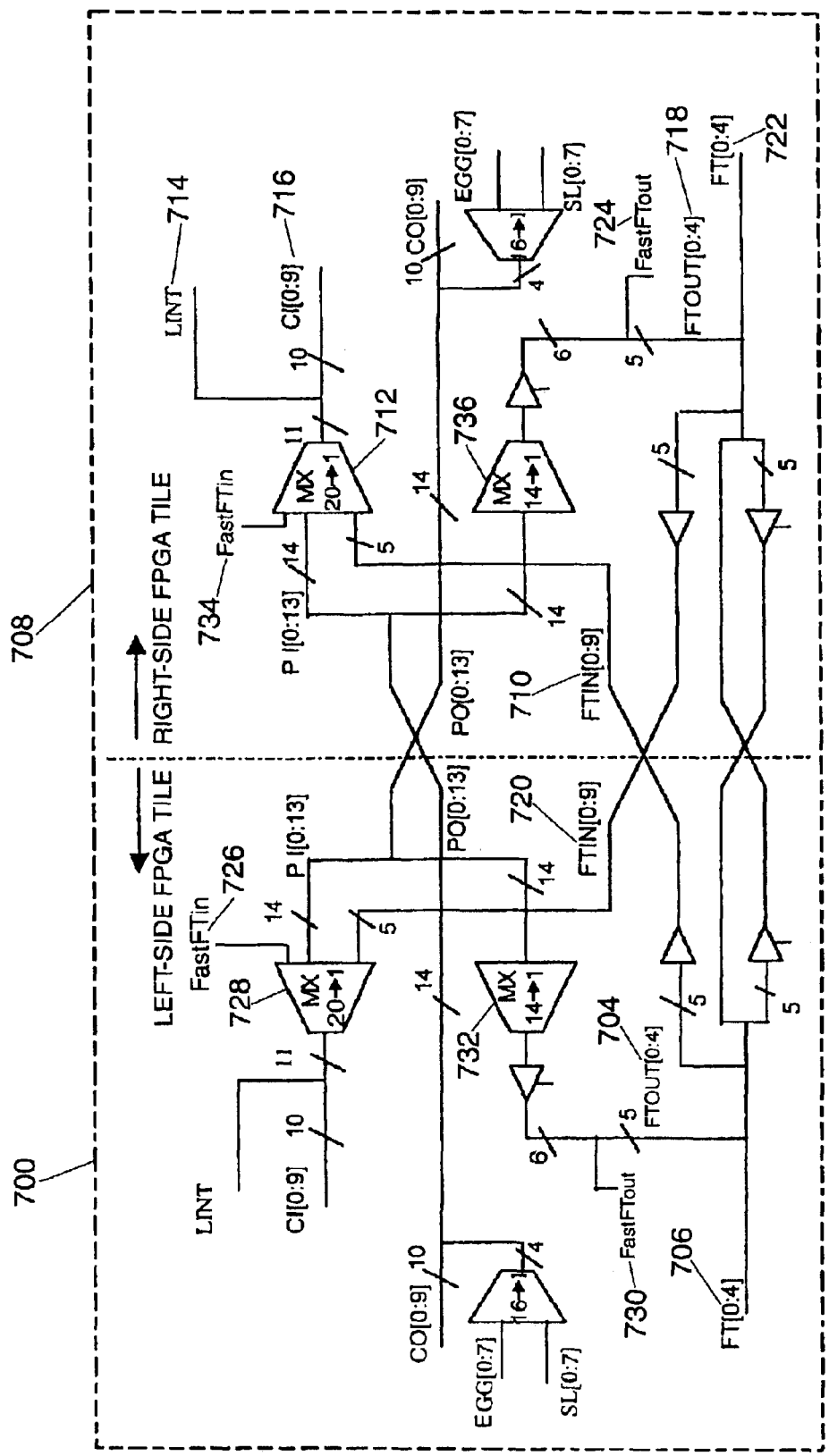
FIG. 10 is a schematic illustrating one embodiment of communications between two interface groups, each on a separate FPGA tile.

FIG. 10 is a schematic illustrating one embodiment of communications between two interface groups, each on a separate FPGA tile. Interface group 700, on a left-side FPGA tile, has FTOUT[0:4] output 704 which is coupled to freeway routing resource FT[0:4] 706. Freeway routing resource FT[0:4] 706 is coupled to interface group 708 on the right-side FPGA tile via FTIN[0:4] track 710. FTIN[0:4] track 710 is coupled to 20 to 1 multiplexer 712, which in turn is coupled to LINT track 714 and CI[0:9] track 716. Similarly, FTOUT[0:4] output 718 of interface group 708 on the right-side FPGA tile and FTIN[0:4] 720 of interface group 700 on the left-side FPGA tile are coupled to freeway routing resource FT[0:4] 722.

Fast-freeway routing resource 724 in interface group 708 is coupled to interface group 700 by fastFTin track 726, which is coupled to the input of 20 to 1 multiplexer 728. Interface group 700 is also coupled to the fast-Freeway routing resource via fastFTout output 730, which is coupled to the output of 14 to 1 multiplexer 732. Similarly, the fast-freeway routing resource is coupled to the interface group 708 by fastFTin track 734, which is coupled to the input of 20 to 1 multiplexer 736. Interface group 708 is also coupled to the fast-freeway routing resource by fastFTout output 724, which is coupled to the output of 14 to 1 multiplexer 736.

The routing interconnect areas include transistor switches and memory cells at many intersections of signal lines, but not at all intersections. From this disclosure, it will be apparent to persons of ordinary skill in the art, however, that the specific number of lines in any of the routing buses may vary in accordance with the present disclosed system. Furthermore, it should be well understood that the specific number of lines in any of the signal buses may vary in accordance with the present disclosed system.

From this disclosure, it will be apparent to persons of ordinary skill in the art that various alternatives to the embodiments of the disclosed system described herein may be employed in practicing the disclosed system. It is intended that the following claims define the scope of the disclosed system and that structures and methods within the scope of these claims and their equivalents be covered thereby.

What is claimed is:

1. A freeway routing system for a field programmable gate array, the field programmable gate array comprising:
an array of field programmable gate array tiles, wherein each field programmable gate array tile comprises:
a plurality of functional groups arranged in rows and columns; and
a plurality of interface groups, each interface group comprising a set of freeway input ports and output ports, wherein:
each row of functional groups has an interface group positioned at each end; and
each column of functional groups has an interface group positioned at each end; and
a freeway set of routing conductors configured to transfer signals to said freeway input ports and from said output ports of said interface groups in each of the field programmable gate array tiles wherein each conductor in the set of freeway conductors includes a break buffer located on each freeway conductor between a freeway input port and an output port of each interface group coupled to said conductor, said freeway set of routing conductors comprising:
a plurality of vertical conductors that form intersections with a plurality of horizontal conductors; and
programmable bi-directional three-state interconnect elements located at said intersections.

2. The field programmable gate array of claim 1, further comprising:
programmable bidirectional three-state interconnect elements on each horizontal conductor and located between each field programmable gate array tile.

3. The field programmable gate array of claim 1, further comprising:
programmable bidirectional three-state interconnect elements on each vertical conductor and located between each field programmable gate array tile.

4. The field programmable gate array of claim 1, further comprising:
at least one input/output pad located on a perimeter around said array of field programmable gate array tiles;
at least one interface group located on said at least one input/output pad; and
wherein said at least one interface group is coupled to said freeway set of routing conductors.

5. The field programmable gate array of claim 1, further comprising:
at least one RAM block located on a perimeter around said array of field programmable gate array tiles;
at least one interface group located on said at least one RAM bock; and
wherein said at least one interface group is coupled to said freeway set of routing conductors.

6. A fast-freeway routing system for a field programmable gate array, the field programmable gate array comprising:
an array of field programmable gate array tiles, wherein each field programmable gate array tile comprises:
a plurality of functional groups arranged in rows and columns;
a plurality of interface groups, wherein:
each row of functional groups has an interface group positioned at each end;
each column of functional groups has an interface group positioned at each end;
N interface groups are positioned along a vertical inner edge of said tile and N interface groups are positioned along a horizontal inner edge of said tile; and each of the interface groups along said vertical inner edge and said horizontal inner edge comprise a set of fast-freeway input and output ports;

a first group of N fast-freeway routing conductors, wherein each of the first through Nth routing conductors of said first group couples the first through Nth interface groups along a first tile's vertical inner edge to the first through Nth interface groups along a second tile's vertical inner edge, to the first through Nth interface groups along the second tile's horizontal inner edge, to the first through Nth interface groups along the third tile's horizontal inner edge, respectively;

a second group of N fast-freeway routing conductors, wherein each of the first through Nth routing conductors of said second group couples the first through Nth interface groups along a second tile's vertical inner edge to the first through Nth interface groups along a second tile's horizontal inner edge, to the first through Nth interface groups along the third tile's horizontal inner edge, to the first through Nth interface groups along the third tile's vertical inner edge, respectively;

a third group of N fast-freeway routing conductors, wherein each of the first through Nth routing conductors of said third group couples the first through Nth interface groups along a second tile's horizontal inner edge to the first through Nth interface groups along a third tile's horizontal inner edge, to the first through Nth interface groups along the third tile's vertical inner edge, to the first through Nth interface groups along the fourth tile's vertical inner edge, respectively; and a fourth group of N fast-freeway routing conductors, wherein each of the first through Nth routing conductors of said fourth group couples the first through Nth interface groups along a third tile's vertical inner edge to the first through Nth interface groups along a fourth tile's vertical inner edge, to the first through Nth interface groups along the fourth tile's horizontal inner edge, to the first through Nth interface groups along the first tile's horizontal inner edge, respectively.

7. The field programmable gate array of claim 6, wherein each of the 4 groups of fast-freeway conductors further comprise:

a break buffer located on each fast-freeway conductor between the fast-freeway input and fast-freeway output of each interface group coupled to said fast-freeway conductor.

8. The field programmable gate array of claim 6, wherein N is equal to 16.

* * * * *